United States Patent [19]

Sado et al.

[11] 4,118,092
[45] Oct. 3, 1978

[54] INTERCONNECTORS

[75] Inventors: Ryoichi Sado, Saitama; Kazutoki Tahara, Omiya, both of Japan

[73] Assignee: Shin-Etsu Polymer Co., Ltd., Tokyo, Japan

[21] Appl. No.: 806,057

[22] Filed: Jun. 13, 1977

[30] Foreign Application Priority Data

Jun. 14, 1976 [JP] Japan ................................ 51-69557

[51] Int. Cl.$^2$ .............................................. H05K 1/04
[52] U.S. Cl. ............................ 339/59 M; 339/17 CF; 339/DIG. 3
[58] Field of Search ............ 339/17 R, 17 LM, 17 M, 339/17 CF, 59 R, 59 M, 61 R, 61 M, DIG. 3

[56] References Cited

U.S. PATENT DOCUMENTS

| 3,398,233 | 8/1968 | DeLizasoain et al. | 339/DIG. 3 |
| 3,971,610 | 7/1976 | Buchoff et al. | 339/DIG. 3 |
| 3,998,512 | 12/1976 | Anhalt et al. | 339/DIG. 3 |
| 4,050,756 | 9/1977 | Moore | 339/59 M |

*Primary Examiner*—Neil Abrams
*Attorney, Agent, or Firm*—Toren, McGeady and Stanger

[57] ABSTRACT

The novel and improved interconnector for making electric connection between the terminal points of electronic circuit units comprises at least one continuum of an electrically insulating material, preferably a silicone rubber, and a plurality of contacts of an electrically conductive material, preferably a carbon-filled silicone rubber, the contacts being discrete from each other, spaced apart and protruding on the lateral surface of the continuum. When two continua are provided, the contacts are sandwiched between them. Various other modifications of the construction are proposed. The interconnectors have the advantage of dimensional accuracy and reliability in electric connection as well as easy in manufacture.

5 Claims, 15 Drawing Figures

FIG. 1
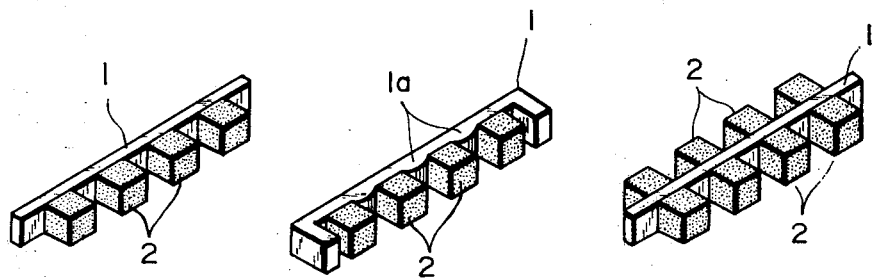
FIG. 2
FIG. 3
FIG. 4
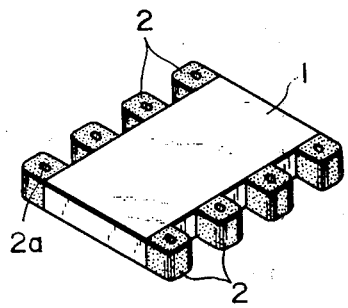
FIG. 5
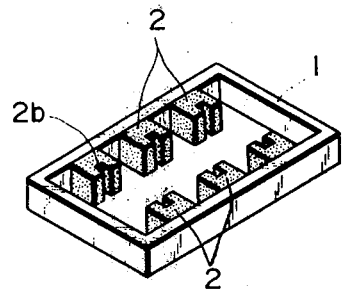
FIG. 6
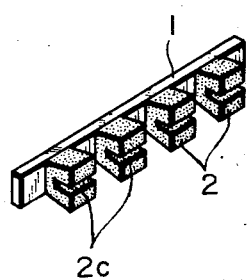
FIG. 7
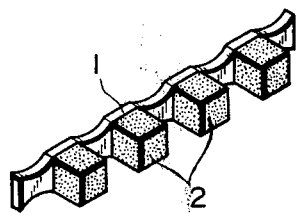
FIG. 8
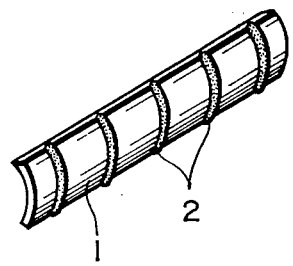
FIG. 8a

INTERCONNECTORS

BACKGROUND OF THE INVENTION

The present invention relates to novel and improved interconnectors that are advantageously employed in connecting an electronic circuit unit or units formed on substrates.

In recent times, interconnectors have widely been employed for the connection of circuit units in various kinds of precision electronic devices. The most widely prevailing ones have a structure formed by integrally and alternately stratifying a plurality of sheets of an electrically conductive material and a plurality of sheets of an electrically insulating material, at least one of the conductive and insulating materials being flexible and elastic, such as a rubbery elastomer, to form a block and cutting the block in the direction of stratification, so that the peripheries of the electrically conductive sheets are exposed and serve as contacts.

More particularly, the conventional interconnectors are manufactured as follows. Electrically conductive and insulating materials are each fabricated into a plurality of sheets with a certain thickness. The thus fabricated sheets of the conductive material are stacked one by one on each sheet of the insulating material to form a stratified block of the desired thickness. The block is then pressed and heated, if necessary, to form an integrated body with the stratified structure. The resultant block is then cut in the direction of the stratification to form a shape having the desired cross section.

In the rod-like interconnectors of this type, the distance between adjacent contact points is determined by the thicknesses of the electrically conductive and insulating sheets, though uncontrollably varied according to the conditions applied to the formation of the block. Therefore, it is very difficult to obtain interconnectors of the kind with a sufficiently exact distance between adjacent contact points.

Further, the interconnector of the above type is usually sandwiched by two electronic circuit units, each having a plurality of terminal points arranged on the plane, so that the corresponding terminal points on both of the circuit units are electrically connected by the contacts of the interconnector. In this arrangement of the circuit units and the interconnector, no satisfactorily good electric contact can always be obtained, because the disposition of the terminal points on the circuit units can not be perfectly even, with some recessed and others protruded, while the electrically conductive rubbery contacts have a smooth and flat surface.

It has therefore been required to ensure a satisfactorily good electric contact between the circuit units and the interconnector by applying a compressive force to the opposite surfaces of the two circuit units, so that the thickness of the interconnector formed of an elastic or flexible material is reduced by 10 to 30%. In this case, the compressive force has to be increased as the size of the circuit units used increases. Accordingly, the electronic circuit units must have a mechanical strength sufficient to withstand the increasing compressive force. Thus, it has been inevitable to lay large restrictions on the design and manufacture of electronic circuit units or device involving the conventional interconnectors.

SUMMARY OF THE INVENTION

The object of the present invention is to provide novel and improved interconnectors free from the above-described disadvantages encountered in the prior art interconnectors having the stratified structure.

The interconnector of the present invention is constructed with at least one continuum formed of an electrically insulating material which is flexible, preferably a rubbery elastomer, and a plurality of contacts formed of an electrically conductive material which is flexible and not necessarily elastic, the contacts being spaced apart, discrete from each other and protruded on the lateral surface of the continuum.

The term "flexible" used herein is equivalent to the property of being able to bend or yield to pressure, while the term "elastic" or "rubbery elastomer" is directed to the property of immediately returning to its original size, shape or position after being depressed, flexed, squeezed, etc. According to the usage herein, flexible materials are inclusive of those which are elastic, i.e. rubbery elastomers, as well as metal wires, metal fabrics, and the like which are not elastic.

BRIEF DESCRIPTION OF THE DRAWINGS

The present invention may be best unerstood by reference to the following description taken in conjunction with the accompanying drawings, in which:

FIG. 1 is a perspective view showing a typical and basic embodiment of the interconnector in accordance with the present invention;

FIGS. 2–10 show modifications to the embodiment of FIG. 1;

DETAILED DESCRIPTION OF THE PREFERRED EMBODIMENTS

Figure 9:
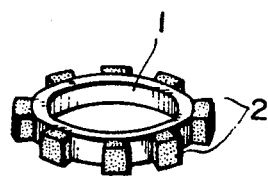

The electrically conductive materials to form the contacts of the interconnector of the invention include various kinds of electrically conductive rubbers and plastics filled with an electroconductivity-imparting powder, such as carbon black, graphite or metal powder; knit, woven or non-woven fabrics of very fine wires or fibers of metals; electrically conductive paints; electrically conductive adhesives; woven or non-woven fabrics of carbon or graphite fibers; woven or non-woven fabrics of glass or synthetic fibers coated or impregnated with an electrically conductive rubber or plastics, and the like.

The electrically insulating, elastic material to form the substrate continuum of the interconnector of the present invention include various kinds of solid or foamed rubbers and synthetic plastics, optionally reinforced with paper, and knit, woven or non-woven fabrics of electrically nonconductive fibers.

According to a preferred embodiment of the invention, the electrically conductive material is a silicone rubber with carbon black dispersed in the matrix, while the electrically insulating material is a silicone rubber without carbon black, the silicone rubbers being either room temperature curing or high temperature curing, since such combination is advantageous in easy mechanical working enabling mass production and performance to obtain good electric contact as well as in the absence of corrosion possible in contact with other parts of the interconnector.

Referring now to FIG. 1, a plurality of contacts 2, each in the form of a cube or rectangular parallelepipedon, are fixedly disposed with regular intervals to protrude on one lateral surface of a strip or belt-like continuum 1 of an electrically insulating material.

FIG. 2 shows a modified interconnector in which a plurality of contacts 2 are disposed on the lateral surface of continuum 1 having a thickening 1a between contacts 2, so that increased rigidity is imparted to continuum 1.

FIG. 3 shows another modified interconnector in which a plurality of contacts 2 are disposed on both the front and back lateral surfaces of a belt-like continuum 1.

FIG. 4 shows a further modified interconnector in which a plurality of contacts are disposed on each opposing peripheral side surface of a slab-like continuum 1, each contact 2 being provided with a small hole 2a.

FIG. 5 shows still a further modified interconnector in which a plurality of contacts 2 are disposed on each opposing inner lateral surface of a square or rectangular frame-like continuum 1, each contact 2 being provided with a groove 2b.

FIG. 6 shows a similar interconnector to that of FIG. 1, except that each contact 2 has a groove 2c provided longitudinally in its contacting surface.

FIG. 7 shows a similar interconnector to that of FIG. 1, except that continuum 1 is shrunken between contacts by heat treatment.

FIG. 8 shows an interconnector that has a plurality of contacts 2 disposed on the lateral surface of a belt-like continuum 1 of a slightly curving shape as shown. FIG. 8a is an enlarged side view of FIG. 8, showing contacts 2 protruded from the continuum 1.

FIG. 9 shows still a further modified interconnector in which a plurality of contacts 2 are disposed on the outer surface of ring-formed continuum 1.

Figure 10:
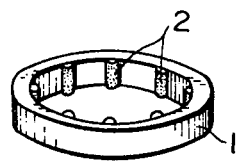

FIG. 10 shows still a further modified interconnector of the ring-formed continuum 1 on the inner surface of which contacts 2 are disposed.

Figure 11:
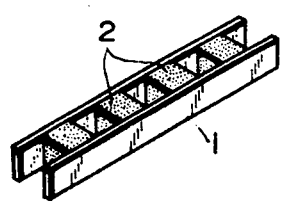
FIG. 11 is a perspective view of another typical embodiment in accordance with the invention.

FIG. 11 shows another typical embodiment in accordance with the present invention in which a plurality of contacts 2, each in the form of a cube or rectangular parallelepipedon, fixedly and discretely disposed between and in contact with the opposing lateral surfaces of two belt-like continua 1.

Figure 12:
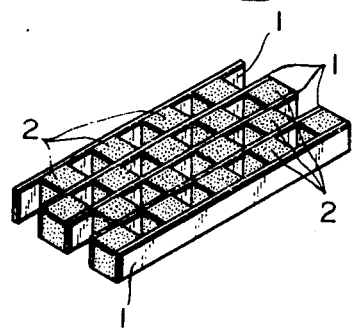
FIGS. 12 and 13 show modifications to the embodiment of FIG. 11.
Figure 13:
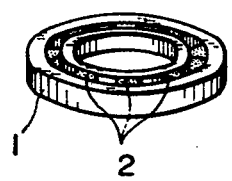

FIGS. 12 and 13 show modifications to the interconnector of FIG. 11. The interconnector shown in FIG. 12 is a multiplex form with a checker board-like appearance. The interconnector shown in FIG. 13 is composed of two coaxial ring-formed continua 1, between which contacts 2 are disposed.

Figure 14:
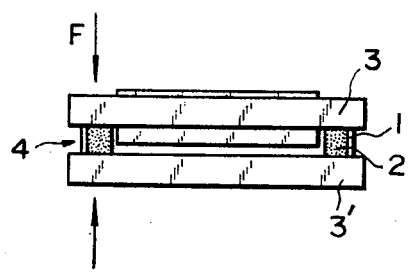
FIG. 14 is a schematic side view of an arrangement in which the interconnector of the present invention is placed between two electronic circuit units.

The interconnectors of the present invention shown in FIGS. 1 to 13 are employed to make electric connection, usually, in the direction up and down as appearing in each view between two electronic circuit units placed in contact with the upper and lower surfaces of each interconnector. FIG. 14 is a schematic side view of such arrangement in which interconnector 4 is placed between two electronic circuit units 3 and 3'. These electronic circuit units 3 and 3' are, respectively, for example, a liquid crystal display panel and an electronic circuit unit to drive the display. By this arrangement, a reliable electric connection can be formed between the terminal points located at opposing positions on the circuit units through the contacts of the interconnector. In order to provide the reliable electric connection, it is preferred that both an outer compressive force F and heat are applied to each of units 3 and 3'. In this case, when the insulating continuum 1 is formed of a material to which heat shrinkability is imparted, while conductive contacts 2 are formed of a material which is not or less heat-shrinkable, the resulting shrinkage of continuum 1 is shown by way of FIG. 7.

Besides the above-described application, there are the following applications of the interconnectors. Those shown in FIGS. 4 and 5 may be applied by utilizing small holes 2a or grooves 2b provided in contacts 2 as the sockets for the pin plugs or terminal points of, for example, large scale integration (LSI) whereby the LSI is electrically connected to another electronic circuit unit. The interconnector shown in FIG. 6 may be applied in a manner such that the terminal points at the periphery of an electronic circuit unit are pinched in grooves 2c or such that a plurality of electronic circuit units, to each of which is attached an interconnector in the above manner, are stacked on each other so that the individual interconnectors are in contact with each other.

Following is the description of the procedure for the preparation of the interconnectors of the invention, but not to limit the scope of the present invention.

In a procedure most widely applicable to the preparation of the interconnectors of the invention, a plurality of wires or rods of an electrically conductive material are fixedly disposed in alignment on a sheet of an electrically insulating material, followed by cutting of the sheet together with the wires or rods in a direction perpendicular to the direction of the alignment of the conductive wires or rods to produce pieces of desired width. This procedure may be undertaken either batchwise with separate sheets or continuously with a rolled sheet of an electrically insulating material. In this case it is recommended that the conductive wires or rods are disposed on the insulating sheet with accurate distances between adjacent ones by being positioned with a suitable jig in the form of a comb, harrow or net or with a grooved roller having a plurality of parallel grooves on the surface. The electrically conductive wires or rods are fixed on the insulating sheet by fusion, hot pressing or adhesion by use of an adhesive. This procedure is applicable to any combinations of the electrically conductive materials and the electrically insulating materials named before and especially suitable for the preparation of the interconnectors as shown in FIGS. 1, 2, 3 and 8.

In an alternative procedure for the preparation of the interconnectors of the present invention, either the sheets of an electrically insulating material or wires or rods of an electrically conductive material are first fabricated in a metal mold and a second metal mold is filled with the thus fabricated sheets or wires or rods together with the other material to give an integrated block which is subsequently sliced with a desired width in a plane perpendicular to the direction of the alignment of the electrically conductive wires or rods. This procedure is applicable when the electrically conductive and the electrically insulating materials are plastics or synthetic rubbers, and especially suitable for the preparation of the interconnectors as shown in FIGS. 1 to 5 and 9 to 11.

Further in addition to the two procedures above described, the interconnectors as shown in FIGS. 4, 5, 9, 10, 12 and 13 are prepared by the techniques of extrusion for bars with irregular cross section with plastics or synthetic rubbers and the interconnector as shown in FIG. 6 can be prepared by bonding together the contacts 2 of an electrically conductive material and a continuum of an electrically insulating material 1 each fabricated separately in advance with suitable adhesive or by providing the contacts 2 on the surface of the continuum 1 in regular dispositions by printing, coating, etching or other suitable means.

The small holes 2a and the small grooves 2b or 2c in the contact points of an electrically conductive material in the interconnectors as shown in FIGS. 4, 5 and 6 may be formed by cutting or grinding of the preformed interconnectors. It is optional that the surfaces of the contact points other than the surface coming into contact with the terminal points to be connected are provided with electrically insulating coating layers, if necessary.

As is described in detail above, the interconnectors of the present invention are composed essentially of an electrically insulating continuum or continua provided on the lateral surface or surfaces with a plurality of contacts of an electrically conductive material fixedly and discretely disposed so that the electric connection between the contacts of the interconnector and the terminal points of the electronic circuit units can be satisfactory even with very much smaller contacting pressure in comparison with the pressure required in the interconnectors of the prior art, thus enabling very versatile design and manufacture of various kinds of electronic circuit devices involving an interconnector of this kind.

Moreover, the practical advantages of the present invention are considerable due to ease in preparation which permits mass production and increased precision in the dimensions of the interconnectors in accordance with the present invention.

What is claimed is:

1. An interconnector comprising an elongated strip of an electrically insulating silicone rubber having a pair of oppositely directed lateral surfaces and a plurality of contacts each shaped as a parallelopipedon and formed of an electrically conductive silicone rubber, said contacts arranged in a row extending in the elongated direction of said strip and secured to and projecting laterally outwardly from one of the lateral surfaces of said strip, each of said contacts having a first surface parallel with and contacting the lateral surface of said strip, a second surface parallel with said first surface and spaced outwardly from said first surface, and side surfaces extending between and interconnecting said first and second surfaces, the side surfaces of adjacent said contacts disposed in spaced relation, each of said second surfaces of said contacts having a straight groove formed therein with the groove extending between two opposed side surfaces of said contact.

2. An interconnector, as set forth in claim 1, wherein said groove in each said contact extending inwardly toward but spaced from said first surface of said contact.

3. An interconnector, as set forth in claim 1, wherein said strip is arranged in the form of a rectangular frame having a first pair and a second pair of opposed elongated sides, each of said opposed sides having an inwardly facing surface directed toward the inside of said frame, said contacts located on the inwardly facing surfaces of said first pair of opposed sides with said grooves extending perpendicularly to the elongated direction of said sides of said frame.

4. An interconnector, as set forth in claim 1, wherein said grooves extend in the elongated direction of said strip.

5. An interconnector, as set forth in claim 1, wherein said strip has a pair of oppositely directed edge surfaces located at the opposite edges of said lateral surfaces and extending between the edges of said pair of lateral surfaces, and the first surface of said contact having a dimension extending transversely of the elongated direction of said strip equal to the dimension between said pair of edge surfaces.

* * * * *